United States Patent
Shu et al.

(10) Patent No.: US 9,947,886 B2
(45) Date of Patent: Apr. 17, 2018

(54) QUANTUM DOT LIGHT EMITTING DIODE, DISPLAY APPARATUS AND ITS MANUFACTURING METHOD

(71) Applicant: BOE Technology Group Co., Ltd., Beijing (CN)

(72) Inventors: Shi Shu, Beijing (CN); Xiaolong He, Beijing (CN); Wei Xu, Beijing (CN); Chuanxiang Xu, Beijing (CN); Yonglian Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/215,104

(22) Filed: Jul. 20, 2016

(65) Prior Publication Data

US 2017/0207406 A1    Jul. 20, 2017

(30) Foreign Application Priority Data

Jan. 20, 2016  (CN) .......................... 2016 1 0037480

(51) Int. Cl.
*H01L 51/50* (2006.01)
*H01L 51/00* (2006.01)
(Continued)

(52) U.S. Cl.
CPC ........ *H01L 51/502* (2013.01); *H01L 27/3246* (2013.01); *H01L 27/3262* (2013.01);
(Continued)

(58) Field of Classification Search
CPC ............... H01L 51/502; H01L 51/0007; H01L 51/0005; H01L 27/3246; H01L 27/3262;
(Continued)

(56) References Cited

U.S. PATENT DOCUMENTS

2009/0221209 A1* 9/2009 Ha ...................... H01L 51/0003
                                                            445/58
2014/0302627 A1* 10/2014 Ko ........................ H01L 51/502
                                                            438/35

FOREIGN PATENT DOCUMENTS

CN         1719637 A      1/2006
CN         1828968 A      9/2006
(Continued)

OTHER PUBLICATIONS

Mar 22, 2017—(CN) Second Office Action Appn 201610037480.8 with English Tran.
(Continued)

*Primary Examiner* — Thanh T Nguyen
(74) *Attorney, Agent, or Firm* — Banner & Witcoff, Ltd.

(57) ABSTRACT

A quantum dot light emitting diode, a display apparatus, and a manufacturing method are provided. The manufacturing method includes forming a first electrode, a first functional layer, a buffer layer, a quantum dot layer, a second functional layer and a second electrode on a base substrate sequentially, wherein the first functional layer is made from organic material, a material for the buffer layer includes a polar organic solvent, and forming the quantum dot layer includes forming a solution including quantum dots and a non-polar organic solvent above the buffer layer using inkjet printing method, the non-polar organic solvent and the polar organic solvent are capable of dissolving each other; and removing the polar organic solvent and the non-polar organic solvent to form the quantum dot layer.

13 Claims, 3 Drawing Sheets

(51) Int. Cl.
*H01L 27/32* (2006.01)
*H01L 51/56* (2006.01)

(52) U.S. Cl.
CPC ...... *H01L 51/0005* (2013.01); *H01L 51/0007* (2013.01); *H01L 51/56* (2013.01); *H01L 51/5056* (2013.01); *H01L 51/5072* (2013.01); *H01L 51/5088* (2013.01); *H01L 2227/323* (2013.01)

(58) Field of Classification Search
CPC . H01L 51/56; H01L 51/5056; H01L 51/5088; H01L 51/5072; H01L 2227/323
See application file for complete search history.

(56) References Cited

FOREIGN PATENT DOCUMENTS

| | | |
|---|---|---|
| CN | 101916831 A | 12/2010 |
| CN | 102960063 A | 3/2013 |
| WO | 03069959 A1 | 8/2003 |
| WO | 2014209154 A1 | 12/2014 |

OTHER PUBLICATIONS

Kiangliang Yang, "Nano Diagnostic Agents", Nano-Drug, Oct. 2007, Tsinghua University Press, Beijing, China, para. 3, p. 340.
Dec. 2, 2016—(CN) First Office Action Appn 201610037480.8 with English Tran.

\* cited by examiner

QUANTUM DOT LIGHT EMITTING DIODE, DISPLAY APPARATUS AND ITS MANUFACTURING METHOD

This application claims priority to and the benefit of Chinese Patent Application No. 201610037480.8 filed on Jan. 20, 2016, which application is incorporated herein in its entirety.

TECHNICAL FIELD

Embodiments of the present disclosure relates to a quantum dot light emitting diode, a display apparatus, and a manufacturing method thereof.

BACKGROUND

A quantum dot is consisted of a limited number of atoms, and has a three-dimensional size in the order of nanometer. Due to quantum size effects, light emitted by quantum dots has a very narrow width at half maximum, has extremely excellent color purity. By making the quantum dot material into a quantum dot light emitting diode (QLED), color gamut better than that in an organic light emitting diode (OLED) display device can be achieved.

SUMMARY

An embodiment of the present invention provides a manufacturing method for a quantum dot light emitting diode, including: forming a first electrode, a first functional layer, a quantum dot layer, a second functional layer, and a second electrode on a base substrate sequentially, the first functional layer being formed with organic material; wherein after forming the first function layer and before forming the quantum dot layer, the method further includes forming a buffer layer material of which includes a polar organic solvent; forming the quantum dot layer includes forming a solution including quantum dots and a non-polar organic solvent on the buffer layer using an inkjet print method, the non-polar organic solvent and the polar organic solvent are capable of dissolving each other; and removing the polar organic solvent and the non-polar organic solvent to form the quantum dot layer.

In one embodiment of the present invention, for example, a boiling point of the polar organic solvent and the non-polar organic solvent is less then 200° C.

In one embodiment of the present invention, for example, the polar organic solvent includes an alcohol or an ether.

In one embodiment of the present invention, for example, the non-polar organic solvent includes an alkane or an aromatic hydrocarbon.

In one embodiment of the present invention, for example, forming the first functional layer includes forming a hole injection layer and a hole transportation layer sequentially on the first electrode using an inkjet printing method.

In one embodiment of the present invention, for example, forming the second functional layer includes forming a electron transportation layer on the quantum dot layer using an inkjet printing method.

An embodiment of the present invention provides a manufacturing method for a display apparatus including forming a quantum dot light emitting diode at a position of each of sub pixels on a base substrate, wherein the sub pixels are partitioned by a pixel defining layer therebetween, and the quantum dot light emitting diode is formed by the manufacturing method as described above.

In one embodiment of the present invention, for example, before forming the first electrode in the quantum dot light emitting diode, the method further includes forming a thin film transistor at the position of each of the sub pixels.

An embodiment of the present invention further provides a quantum dot light emitting diode formed by the manufacturing method as described above.

An embodiment of the present invention provides a display apparatus formed by the manufacturing method as described above.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DESCRIPTION OF THE REFERENCE NUMERALS

10—base substrate; 20—anode; 301—hole transportation layer; 302—hole injection layer; 40—quantum dot layer; 401—solution; 501—electron transportation layer; 502—electron injection layer; 60—cathode; 70—first electrode; 80—first functional layer; 90—buffer layer; 100—second functional layer; 110—second electrode; 120—thin film transistor; 200—sub pixel; 300—pixel defining layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
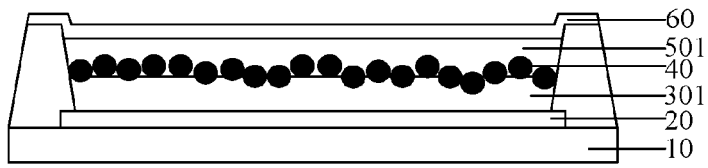
FIG. 1 is a schematic structure diagram of a conventional QLED.

As shown in FIG. 1, a QLED provided by an embodiment of the present invention may include a base substrate 10, and an anode 20, a hole transportation layer 301, a quantum dot layer 40, an electron transportation layer 501 and a cathode 60 sequentially formed on the base substrate 10. Currently, when quantum dots are used as a light emitting layer of the QLED, an inkjet printing method is a practical patterning method for mass production. Thus, the quantum dot needs to be dissolved in a non-polar organic solvent to form a solution, and then the printing can be performed.

However, since the hole transportation layer 301 is made from organic material, it can be dissolved by the non-polar organic solvent when manufacturing the quantum dot layer 40, as a result, the hole transportation layer 301 is corroded and the quantum dot layer 40 becomes uneven, and hence the performance of the QLED is degraded.

Figure 2:
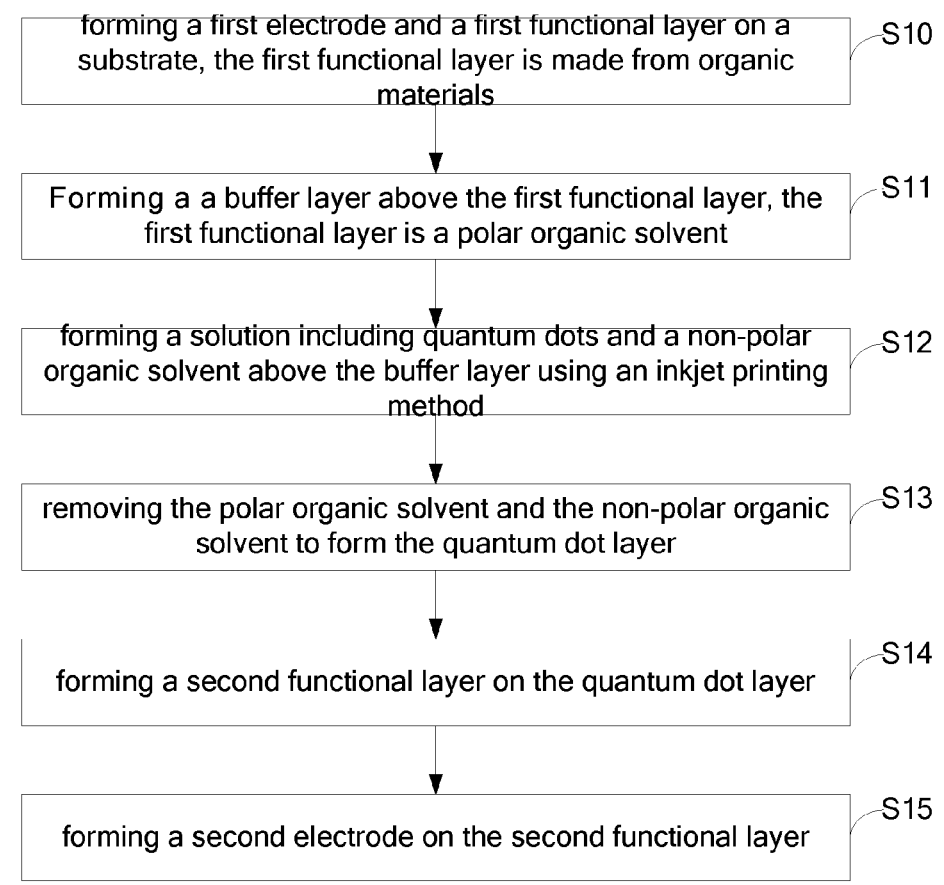
FIG. 2 is a schematic diagram showing a flowchart of manufacturing a QLED as provided by an embodiment of the present invention.
Figure 3:
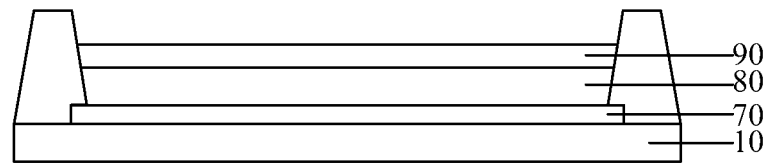
FIGS. 3-6 are schematic diagrams showing a process for manufacturing a QLED as provided by an embodiment of the present invention.

In order to address the above problems, in an embodiment of the present invention, a manufacturing method for QLED is provided. As shown in FIG. 2, the manufacturing method includes:

S10, as shown in FIG. 3, forming a first electrode 70 and a first functional layer 80 sequentially on the base substrate 10, the first functional layer 80 is made from organic material.

Here, the first functional layer 80 may be one signal layer, and also may be two or more layers.

S11, as shown in FIG. 3, forming a buffer layer 90 on the first functional layer 80, material for the buffer layer 90 is a polar organic solvent.

Here, any kinds of polar organic solvent can be used, as long as it can dissolve the non-polar organic solvent in the following S12. The buffer layer 90 can be formed by a solution.

Figure 4:
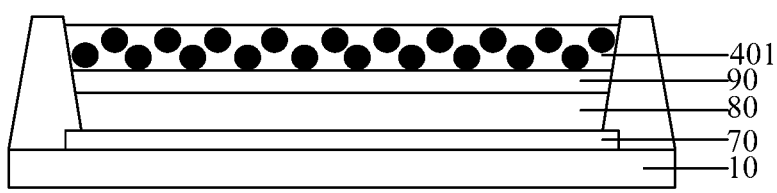

S12, as shown in FIG. 4, on the buffer layer, forming a solution 401 including a quantum dot and a non-polar organic solvent above the buffer layer 90 using the inkjet printing method.

When the solution 401 including the quantum dot and the non-polar organic solvent is formed above the buffer layer 90, the polar organic solvent of the buffer layer 90 dissolves and annexes the non-polar organic solvent contacted therewith, so that the quantum dot is extracted.

Figure 5:
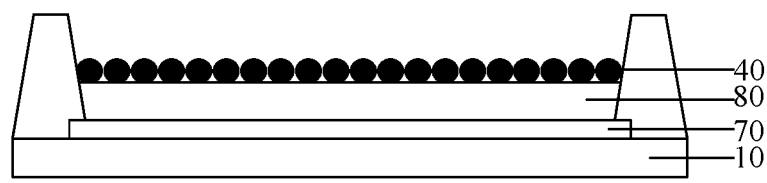

S13, as shown in FIG. 5, evaporating the solvent to form the quantum dot layer 40. The quantum dot layer is deposited on the first functional layer 80. The solvent, as used herein, includes the polar organic solvent and the non-polar organic solvent.

Figure 6:
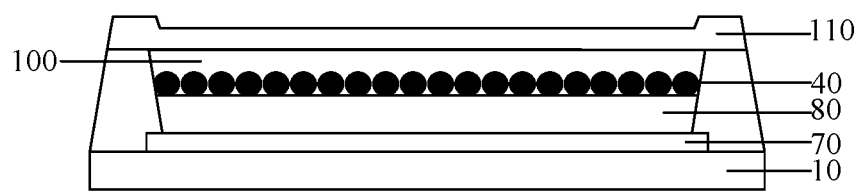

S14, as shown in FIG. 6, forming a second functional layer 100 on the quantum dot layer 40.

Here, the second functional layer 100 may be a single layer, and may also be two or more layers.

S15, as shown in FIG. 6, forming a second electrode 100 on the second functional layer 100.

It is to be noted that firstly, the first electrode 70 and the second electrode 110 can interchangeably be an anode or a cathode.

Wherein, when the first electrode 70 is an anode and the second electrode 110 is a cathode, the first functional layer 80 is a film layer for assisting to inject holes from the anode, and the second functional layer 100 is a film layer for assisting to inject electrons from the cathode. Of course, the above anode and the cathode can be interchanged, and at the same time, the first functional layer 80 and the second functional layer 100 need also to be interchanged.

Secondly, since the polar organic solvent and the non-polar organic solvent will be finally evaporated, the boiling point of the polar organic solvent and the non-polar organic solvent should be selected so as to avoid negatively affecting the base substrate and other film layers by high temperature incurred during heating.

An embodiment of the present invention provides a manufacturing method for QLED, wherein the buffer layer 90 having the polar organic solvent is formed before forming the quantum dot layer 40, and the polar organic solvent in the buffer layer 90 dissolves the non-polar organic solvent contacted therewith, so that the quantum dot is extracted to be deposited on the first functional layer 80. Wherein, because the non-polar organic solvent is dissolved by the polar organic solvent in the buffer layer 90, corrosion of the organic material in the first functional layer 80 by the non-polar organic solvent can be effectively avoided, and thus the quantum dot layer 40 is enabled to be evenly filmed, a relative well interface between film layers can be achieved, and the performance of the QLED can be improved.

In order to prevent evaporation of the solvent from damaging the base substrate 10 and the other film layers which have been formed, preferably, the boiling point of the polar organic solvent and the non-polar organic solvent are both lower than 200° C., for example, the boiling point can be lower than 150° C.

Based on the above considerations, in the embodiment of the present invention, the preferred polar organic solvent includes alcohols, ethers due to their low boiling point, volatility, ease to preparation, and so on. For example, the polar organic solvent is at least one of ethanol, propanol, isopropyl alcohol, butyl alcohol, isobutyl alcohol, dimethylether and ethyl ether.

Considering alkanes and aromatic hydrocarbons are advantageous in spreading the quantum dot to form a stable solution, in the embodiment of the present invention, for example, the non-polar organic solvent includes an alkane or an aromatic hydrocarbon. For example, the non-polar organic solvent is chain alkane, cyclone alkane, haloalkane, aromatic hydrocarbon, and so on, such as pentane, hexane, heptane, octane, cyclopentane, cyclohexane, benzene, methylbenzene, and so on.

Wherein material for the quantum dot can be at least one of cadmium selenide (CdSe), cadmium telluride (CdTe), zinc oxide (ZnO), zinc sulfide (ZnS), zinc selenide (ZnSe), zinc telluride (ZnTe), gallium arsenide, mercury sulfide (HgS), indium arsenide (InAs), indium antimonide.

Figure 7:
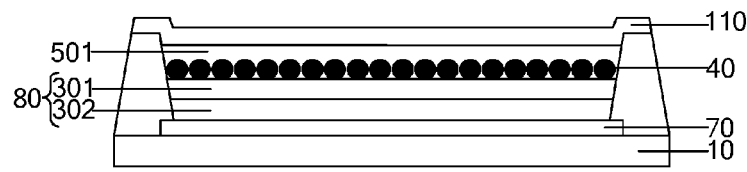
FIG. 7 is a schematic diagram showing a structure of a QLED provided by an embodiment of the present invention.

For example, the first electrode 70 is an anode, and the second electrode 110 is a cathode. As shown in FIG. 7, forming the first functional layer 80 in S10 includes forming a hole injection layer 302 and a hole transportation layer 301 sequentially above the first electrode 70 using the inkjet printing method.

Wherein material for the hold transportation layer 301 can be organic aromatic amine, e.g. triarylamines.

Of course, an electron blocking layer can be formed above the hole transportation layer 301 using the inkjet printing method.

For example, the first electrode 70 can be transparent. For example, the first electrode 70 can be made from transparent conductive material such as indium tin oxide (ITO), indium zinc oxide (IZO), or the like. The first electrode may also be opaque, for example, is made by interposing a layer of opaque metal layer between two transparent conductive layers, so as to match HOMO/LUMO energy levels of the first electrode 70 with that of the first functional layer 80, and facilitate injecting holes from the first electrode 70 into the quantum dot layer 40.

The second electrode 100 may be semitransparent or opaque. Regardless of being semitransparent or opaque, its material always can be metal material, what is needed is to control the thickness of the metal material according to the semitransparent or opaque requirement. For example, the second electrode 110 can be made from metal material. For example, the second electrode 110 may be metal element, such as silver (Ag), aluminum (Al), lithium (Li), magnesium (Mg), or the like; or may be metal alloy, such as Mg:Ag alloy, Li:Al alloy, or the like.

In the embodiments of the present invention, the hole injection layer 302 and the hole transportation layer 301 can be formed using inkjet method, by which the material utilization can be improved.

For example, as shown in FIG. 7, forming the second functional layer 100 in S14 includes forming an electron transportation layer 501 above the quantum dot layer 40 using the inkjet printing method.

Wherein material for the electron transportation layer 501 can be metal oxide.

Figure 8:
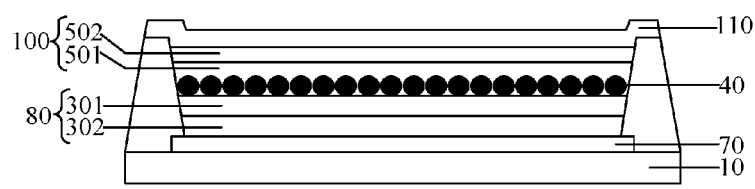
FIG. 8 is a schematic diagram showing another structure of a QLED provided by an embodiment of the present invention.

For example, as shown in FIG. 8, an electron injection layer 502 can be further formed above the electron transportation layer 501 using the inkjet printing method. For example, a hole blocking layer can also be formed using the inkjet printing method after forming the quantum dot layer 40 and before forming the electron transportation layer 501.

In the embodiments of the present invention, the material utilization can be improved by using the inkjet printing method to form the electron transportation layer 501 and so on.

For example, in S11, the buffer layer 90 can also be formed using the inkjet printing method.

Hereinafter, a manufacturing method for QLED as shown in FIG. 8 will be described in detail. The method includes:

S101, forming a first electrode 70, a hole injection layer 302 and a hole transportation layer 301 on a base substrate sequentially, the first electrode 70 is an anode.

Wherein the material for the first electrode 70 can be ITO and can be prepared through sputtering method.

The material for the hole injection layer 302 can be a product in the brand of AI-4083, for example, is a mixture of poly (3,4-ethylenedioxythiophene) and polyphenylene sulfide. The material for the hole transportation layer 301 can be poly(9,9-dioctylfluorene-co-N-(4-butylphenyl)diphenylamine) (TFB). Both layers can be formed using the inkjet printing method.

S102, forming a buffer layer 90 on the hole transportation layer 301 using the inkjet printing method.

Wherein the material for the buffer layer 90 may be ethanol.

S103, on the buffer layer 90, a solution 401 including a quantum dot and a non-polar organic solvent is formed above the buffer layer 90 using the inkjet printing method.

When the solution 401 including the quantum dot and the non-polar organic solvent is formed above the buffer layer 90, the polar organic solvent in the buffer layer 90 dissolves and annexes the non-polar organic solvent contacted therewith, so that the quantum dot is extracted.

S104, evaporating the solvent to form the quantum dot layer 40.

S105, on the quantum dot layer 40, forming an electron transportation layer 50, an electron injection layer 502, and a second electrode 100 sequentially, the second electrode 110 is a cathode.

Wherein the material for the electron transportation layer 501 can be nano-particles of zinc oxide, and the material for the electron injection layer 502 can be zinc magnesium oxide or lithium fluoride, both the layers are prepared using the inkjet printing method.

The material for the second electrode 110 can be Ag, and can be prepared by evaporating method.

An embodiment of the present invention further provides a QLED, as shown in FIG. 6 to FIG. 8, the QLED can be obtained by the manufacturing method described above.

Since the buffer layer 90 with the polar organic solvent is formed before forming the quantum dot layer 40, the polar organic solvent in the buffer layer 90 dissolves the non-polar organic solvent contacted therewith, so that the quantum dot is extracted and is deposited on the first functional layer 80. Wherein, because the non-polar organic solvent is dissolved by the polar organic solvent in the buffer layer 90, corrosion of the organic material in the first functional layer 80 by the non-polar organic solvent can be avoided, and thus the quantum dot layer 40 can be evenly filmed, a better film layer interface can be obtained, and thus the performance of the QLED can be improved.

Figure 9:
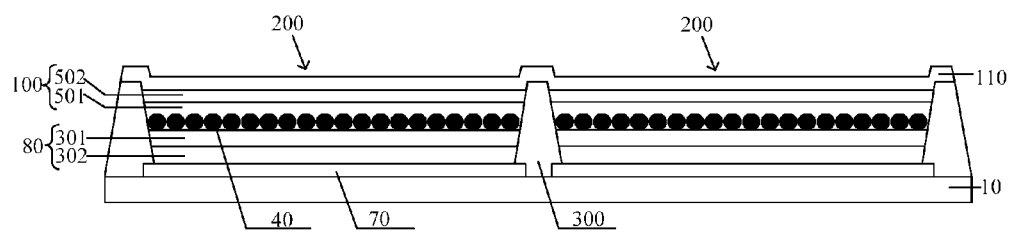
FIG. 9 is a schematic diagram showing a structure of a display apparatus provided by an embodiment of the present invention.

An embodiment of the present invention further provides a manufacturing method for a display apparatus. As shown in FIG. 9, the method includes forming a QLED on a base substrate 10 at position of each of sub pixels 200. The sub pixels 200 are partitioned by a pixel defining layer 300 therebetween, wherein the QLED is formed by the manufacturing method described above.

Figure 10:
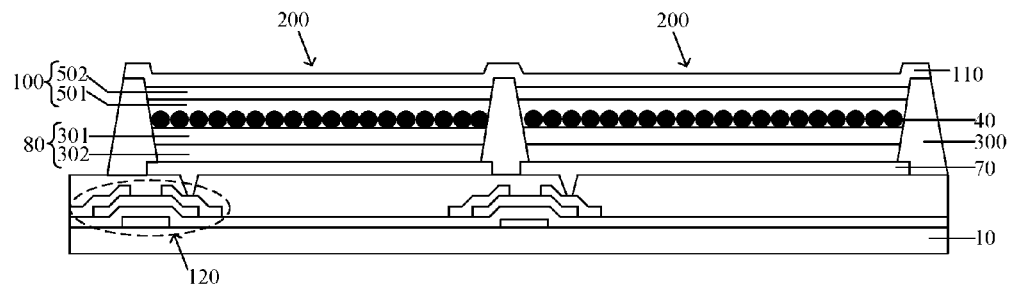
FIG. 10 is a schematic diagram showing another structure of a display apparatus provided by an embodiment of the present invention.

Based on this, considering the shortcomings occurred when a passive matrix is applied in a large size display, for example, the display apparatus provided by the embodiment of the present invention is an active matrix display apparatus. That is, as shown in FIG. 10, before the first electrode 70 in the QLED is formed, the manufacturing method for the display apparatus further includes forming a thin film transistor 120 at the position of each of the sub pixels 200.

Wherein the thin film transistor 120 includes a gate electrode, a gate insulation layer, a semiconductor active layer, a source electrode and a drain electrode, wherein the thin film transistor 120 may be of a top gate type, and may also be of a bottom gate type.

Of course, the manufacturing method for the display apparatus further includes forming gate lines, gate line leads, etc. electrically connected with the gate electrode, and data lines, data line leads, etc. electrically connected with the source electrode.

An embodiment of the present invention further provides a display apparatus, which is formed by the above described manufacturing method for the display apparatus.

The display apparatus can be a television, a digital camera, a mobile phone, a tablet computer, and any other product or component having display function.

What are described above is related to the illustrative embodiments of the disclosure only and not limitative to the scope of the disclosure; the scopes of the disclosure are defined by the accompanying claims.

The present application claims the priority of the Chinese Patent Application No. 201610037480.8 filed on Jan. 20, 2016, which is incorporated herein by reference as part of the disclosure of the present application.

The invention claimed is:

1. A manufacturing method for a quantum dot light emitting diode, including forming a first electrode, a first functional layer, a buffer layer, a quantum dot layer, a second functional layer and a second electrode on a base substrate sequentially, the first functional layer being formed with an organic material, wherein:

a material for the buffer layer includes a polar organic solvent;

forming the quantum dot layer includes:

forming a solution including quantum dots and a non-polar organic solvent above the buffer layer using an inkjet printing method, wherein the non-polar organic solvent and the polar organic solvent are capable of dissolving each other, wherein the polar organic solvent of the buffer layer dissolves and annexes the non-polar organic solvent contacted therewith, so that the quantum dots are extracted; and removing the polar organic solvent and the non-polar organic solvent to form the quantum dot layer.

2. The manufacturing method according to claim 1, wherein a boiling point of the polar organic solvent and a boiling point of the non-polar organic solvent are both less than 200° C.

3. The manufacturing method according to claim 2, wherein the polar organic solvent includes an alcohol or an ether.

4. The manufacturing method according to claim 2, wherein the non-polar organic solvent includes an alkane or an aromatic hydrocarbon.

5. The manufacturing method according to claim 2, wherein forming the first functional layer comprises:

forming a hole injection layer and a hole transportation layer sequentially above the first electrode using the inkjet printing method.

6. The manufacturing method according to claim 2, wherein forming the second functional layer comprises:

forming an electron transportation layer above the quantum dot layer using the inkjet printing method.

7. The manufacturing method according to claim 1, wherein forming the first functional layer includes:

forming a hole injection layer and a hole transportation layer sequentially above the first electrode using the inkjet printing method.

8. The manufacturing method according to claim 1, wherein forming the second functional layer includes:

forming an electron transportation layer above the quantum dot layer using the inkjet printing method.

9. A manufacturing method for a display apparatus, including forming a quantum dot light emitting diode on a base substrate at a position of at least one of a plurality of sub pixels, wherein the quantum dot light emitting diode is formed by the manufacturing method according to claim 1.

10. The manufacturing method according to claim 9, wherein the plurality of sub pixels are partitioned by a pixel defining layer therebetween.

11. The manufacturing method according to claim 9, wherein before forming the first electrode in the quantum dot light emitting diode, the method further comprises:

forming a thin film transistor at the position of the at least one of the plurality of sub pixels.

12. A display apparatus formed by the manufacturing method according to claim 9.

13. A quantum dot light emitting diode, formed by the manufacturing method according to claim 1.

* * * * *